United States Patent [19]
Kraitsberg

[11] Patent Number: 5,280,011
[45] Date of Patent: Jan. 18, 1994

[54] ALIGNMENT TECHNIQUE FOR ANISOTROPICLY CONDUCTIVE CRYSTALS UTILIZING A NON-STATIC MAGNETIC FIELD

[75] Inventor: Alexander M. Kraitsberg, Newton, Mass.

[73] Assignee: Northeastern University, Boston, Mass.

[21] Appl. No.: 876,357

[22] Filed: Apr. 30, 1992

[51] Int. Cl.[5] ............... C01F 11/02; C01G 3/02; H01B 1/06; H01L 39/24
[52] U.S. Cl. ................................. 505/1; 264/24; 505/727
[58] Field of Search ............... 505/727, 1; 264/24

[56] References Cited

U.S. PATENT DOCUMENTS

| | | | |
|---|---|---|---|
| 4,288,398 | 9/1981 | Lemelson | 264/23 |
| 4,536,230 | 8/1985 | Landa et al. | 148/31.57 |
| 4,614,619 | 9/1986 | Shannon | 260/397.2 |
| 4,708,764 | 11/1987 | Boden et al. | 156/617 R |
| 4,765,055 | 8/1988 | Ozaki et al. | 29/599 |
| 4,775,576 | 10/1988 | Bouchand et al. | 428/216 |
| 4,778,635 | 10/1988 | Hechtman | 264/24 |
| 4,798,765 | 1/1989 | Ishizaka et al. | 428/336 |
| 4,802,931 | 2/1989 | Croat | 148/302 |
| 4,806,176 | 2/1989 | Harase et al. | 148/111 |
| 4,818,500 | 4/1989 | Boden et al. | 422/249 |
| 4,842,704 | 6/1989 | Collins et al. | 204/192.24 |
| 4,842,708 | 6/1989 | Kadokura et al. | 204/298 |
| 4,853,660 | 8/1989 | Schloemann | 333/204 |
| 4,857,415 | 8/1989 | Tustison et al. | 428/620 |
| 4,859,410 | 8/1989 | Brewer et al. | 419/10 |
| 4,939,121 | 7/1990 | Rybka | 505/1 |
| 5,079,225 | 1/1992 | Holloway | 505/727 |
| 5,114,905 | 5/1992 | Giessen | 505/727 |

FOREIGN PATENT DOCUMENTS

| | | | |
|---|---|---|---|
| 0081172 | 3/1989 | Japan | 505/727 |
| 2-192622 | 7/1990 | Japan | 505/1 |
| 0956307 | 9/1982 | U.S.S.R. | 264/24 |

OTHER PUBLICATIONS

"Critical Current Enhancement in Field-Oriented $YBa_2Cu_3O_{7-\delta}$", K. Chen et al., Appl. Phys. Lett., 55(3), Jul. 17, 1989, pp. 289-291.

$Ba_2YCu_3O_{7-\delta}$ Crystal Surface Layers Orthorhombic Splitting, Dislocations and Chemical Etching, D. J. Werder et al., Physica C 160, (1989), 411-416.

Primary Examiner—Paul Lieberman
Assistant Examiner—John Boyd
Attorney, Agent, or Firm—Weingarten, Schurgin, Gagnebin & Hayes

[57] ABSTRACT

A method of processing polycrystalline material to achieve at least uniaxial crystal alignment utilizing the anisotropy of conductivity of the crystalline material. The polycrystalline material is provided in a fluid suspension or other malleable form. A non-static magnetic field is applied to the crystalline material. Eddy currents induced in the individual crystals as a result of the non-static magnetic field generate a magnetic moment in the individual crystals which aligns itself and thus the individual crystals parallel to the applied non-static magnetic field, thus producing in-plane alignment of the crystals. Further processing including multi-axis crystal alignment is also disclosed utilizing the same procedure.

13 Claims, 4 Drawing Sheets

ALIGNMENT TECHNIQUE FOR ANISOTROPICLY CONDUCTIVE CRYSTALS UTILIZING A NON-STATIC MAGNETIC FIELD

FIELD OF THE INVENTION

This invention relates to the processing of polycrystalline materials and more particularly, to the processing of superconductor and other polycrystalline materials by performing alignment of the individual crystalline grains utilizing the inherent anisotropy of conductivity of the crystal and an applied non-static magnetic field.

BACKGROUND OF THE INVENTION

Proposed uses and advantages for high current, high transition temperature superconductors have not been realized, given that commercially usable superconductor materials in bulk form (including thick films) are still generally unavailable. Superconductor refers here and in the following description to the class of ceramic superconductors containing copper oxide or other oxides and having superconductivity transition temperatures (T(c)) generally above the liquid nitrogen boiling temperature (77K). Critical currents J(c) greater than $10^4$ A/cm$^2$ at magnetic fields of 10T are considered necessary for practical, current carrying applications. A small amount of superconductor material with such critical current carrying capability has been fabricated but no proven method exists for repeatably or controllably fabricating a bulk superconductor material with such high J(c) at operating temperatures of 77K. Currently, superconductors with high values of J(c) can be produced only in epitaxial thin films and monocrystals. Both are unsuitable and impractical for most commercial applications. Thick superconductor films of high J(c) may be produced by a melt-textured growth process. However, these films cannot be made a practical thickness without loss of grain orientation and accompanying drop of J(c).

It has been previously shown that low values of J(c) result from the disorientation of the crystal lattice structure. The crystal lattice of all presently known high-T(c) superconductors is considerably anisotropic, and includes a high-current carrying (ab) plane. These are also the planes of high conductivity in a normal state, whereas the conductivity in the crystal c-direction, normal to (ab) plane, is several orders of magnitude lower than the conductivity along the (ab) plane direction.

The use of superconductor material (such as Y-Ba-Cu-O-compound) in which crystalline grains are aligned in a strong magnetic field along the c-axis results in some increase of J(c). See U.S. Pat. No. 4,288,398 and U.S. Pat. No. 4,842,704. Recently, it has been shown that the use of multi-axial alignment of superconductor crystals utilizing two anisotropic properties of the crystals that are perpendicular to one another results in a considerable increase in critical current carrying capability. See U.S. application Ser. No. 07/490,752. This multi-axial alignment is accomplished by using two forces of different origin. The first alignment force to which the crystals are reactive is provided to align the crystals along the c-axis to orient the crystals coplanar in the (ab) plane with one another. The crystals are also subjected to a magnetic field to provide the second alignment force. This magnetic force aligns a magnetic moment of the crystals along an axis that lies within the conducting plane and which is generally transverse to the c-axis. This magnetic moment, however, is primarily the result of adding a rare earth element to the crystalline material and thus, not all superconductor material contains or is capable of receiving such an added element. Most importantly, every superconductor material to which has been added a rare earth element may align along a different axis based upon the crystalline material itself and the added rare earth element.

It has been further suggested to align the crystals along a first axis by such alignment forces as gravity, centrifugal force, deforming or shear pressure, or an electric field Accordingly, a superconducting material must be provided having either a shape anisotropy to produce the alignment along the first axis by means of gravitational or centrifugal pressing, which mechanically urges the crystals into intended alignment; having deformation anisotropy to provide the alignment by use of pressure, rolling or other shear deformation force; and having an electrical anisotropy to provide the alignment by an applied electric field. The above features are not inherent features of oxide superconductors so these conditions restrict the spectrum of materials available for axial alignment.

SUMMARY OF THE INVENTION

The method of the present invention includes the provision of crystals having an anisotropy of conductivity at the temperature of alignment (typically at room temperature). This anisotropy of conductivity is an inherent feature of high-T(c) superconductors wherein the conductivity in the (ab) plane exceeds any conductivity along the c-axis by several orders of magnitude. Moreover, the anisotropy of conductivity may be provided by an anisotropy of crystal structure as well as by an anisotropy of crystal shape.

The crystals are provided in a liquid suspension or in otherwise fluent form, such as semimolten, viscous or powder form, which allows the crystals to move and orient themselves as a result of the alignment force's action. The crystals are subjected to a changing or non-static homogeneous magnetic field or to a combination of changing homogeneous magnetic field and permanent homogeneous magnetic field. The aligning force is created by interaction between a magnetic moment induced in the individual crystals produced by eddy currents in response to the applied non-static magnetic field, and the applied magnetic field. The alignment of the crystalline material is maintained as the material becomes fixed or static, so that in the fixed state, the crystals retain their aligned condition.

One or more rare earth constituents may be added to the crystals which serves to provide the crystals with a "built-in" or intrinsic magnetic moment along a readily determinable axis that lies within the (ab) plane and perpendicular to the direction of the proposed first axis of alignment of this invention, to provide multi-axial alignment.

The invention is described herein primarily with respect to superconductor materials. It is contemplated, however, that the invention is also applicable to other crystalline materials having a highly conductive plane where in-plane alignment of crystals utilizing a magnetic field is desired to achieve intended material properties. Many materials with other anisotropic properties would also benefit from post-preparation, in-plane orientation.

DESCRIPTION OF THE DRAWINGS

These, and other features and advantages of the present invention will be better understood by reading the following detailed description, taken together with the drawings wherein.

DETAILED DESCRIPTION OF THE INVENTION

In accordance with the present invention, the processing of crystalline material having a single plane of preferential conductivity includes providing the crystals in a fluid or flowable or molten state that allows the crystals freedom of movement in response to applied external forces and applying to these crystals a non-static or changing (over time) magnetic field or a combination of a non-static magnetic field and a constant magnetic field.

In the case of applying a constant magnetic field, the value of constant magnetic field should be at least one order of magnitude larger then a maximal value of the variable or non-static magnetic field. Further, the angle between the vectors of the constant magnetic field and the non-static magnetic field is preferably between 90° and 180°. This angle allows the crystals' planes of high conductivity to be aligned normal to the direction of the non-static magnetic field or normal to the direction of the constant magnetic field.

Figure 1A:
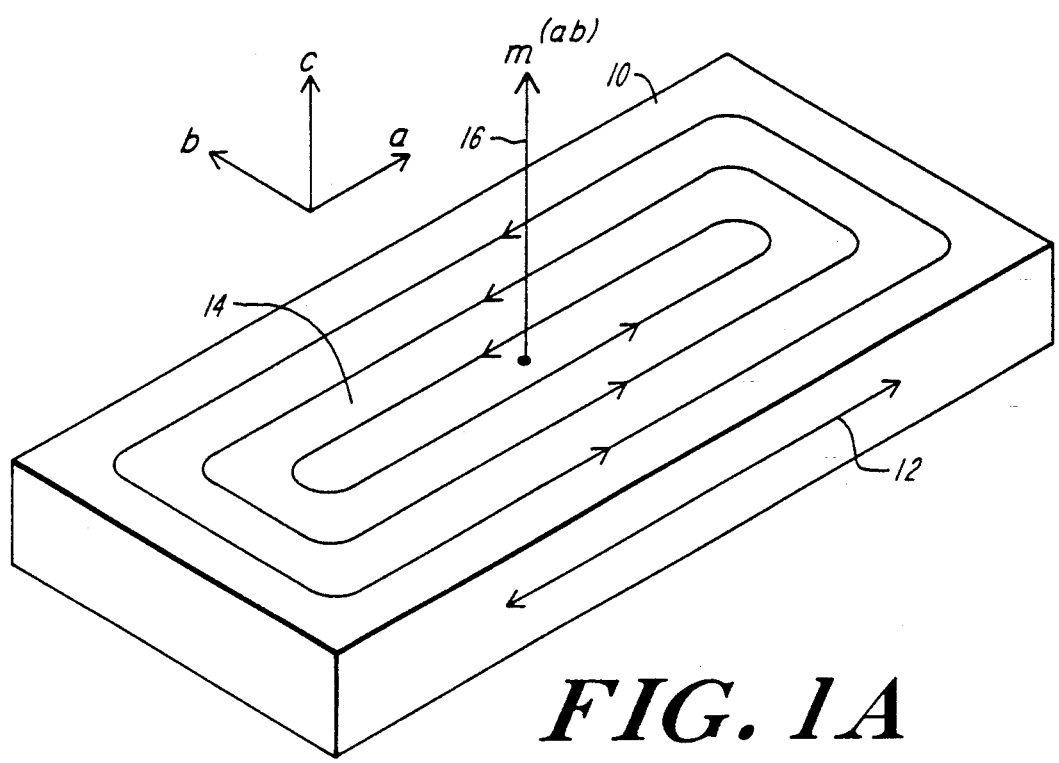
FIGS. 1A and 1B are schematic representations of a crystal illustrating its a, b and c axes, plane (ab) of high conductivity, and induced eddy currents and magnetic moments.
Figure 1B:
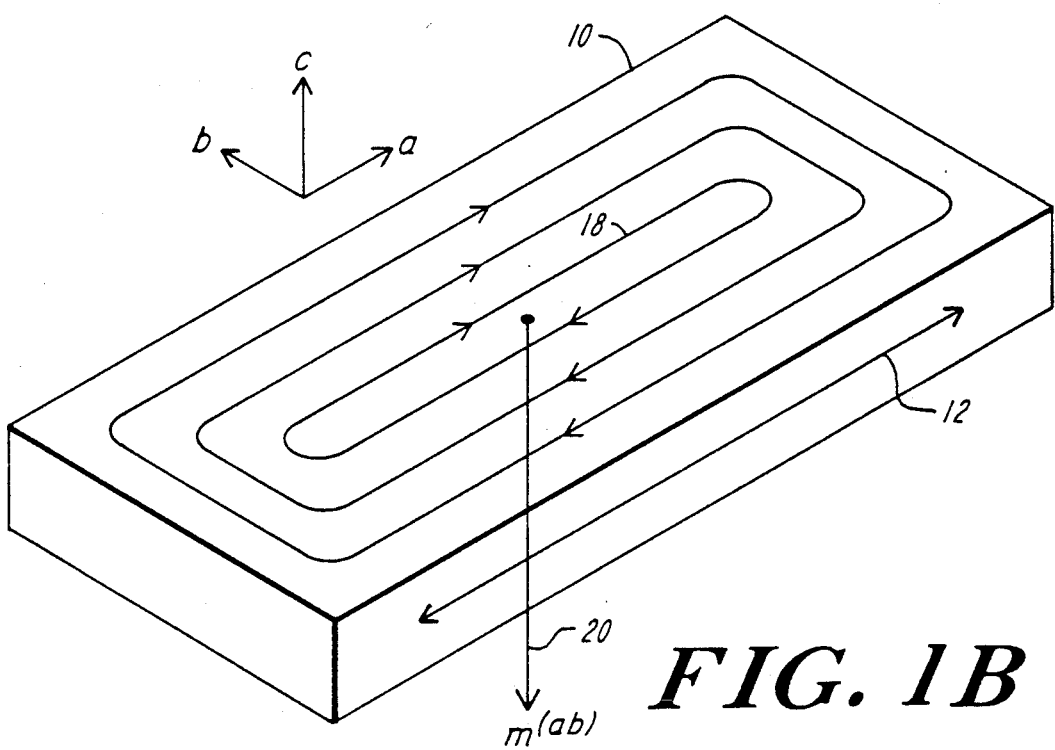

As illustrated in FIGS. 1A and 1B, the present invention is operative with superconductor or other similar crystals such as crystal 10 which are typically ceramic cuprates that may include a bismuth compound superconductor material or other oxide superconductor crystals as is currently well known to those skilled in the art. Additionally, the superconductor materials may contain a combination of rare earth constituents (RE) such as Europium or Ytterbium as is disclosed in U.S. patent application Ser. No. 07/490,752 which is incorporated herein by reference. Further, yet to be discovered superconductor materials are considered to be within the scope of the present invention.

A common characteristic of superconductor crystals 10 is the inherent preferential anisotropy of conductivity of the crystals, typically in the (ab) plane as illustrated by arrow 12. The superconductor crystals are typically provided with diameters in the range of 1–30 μm. In addition, the crystals may be etched to remove approximately 1 μm of the surface layer of the crystals to enhance intergrain coupling.

Superconductor crystals such as crystal 10, all of which have the inherent feature or preferential plane of high conductivity, will exhibit a similar and predetermined characteristic namely, when exposed to a magnetic field, eddy currents, whose direction and strength is a function of whether the applied magnetic field is increasing or decreasing, and of the rate of increase or decrease over time ($dB\sim/dt$). For example, a decreasing magnetic field will form counterclockwise eddy currents illustrated by arrow 14 which in turn will induce a magnetic moment $m^{(ab)}$ indicated by arrow 16 in a first direction, whereas an increasing magnetic field will produce clockwise eddy currents indicated generally at 18 which in turn will induce a magnetic moment $m^{(ab)}$ 20 in a direction opposite that of the first magnetic moment 16.

Figure 2:
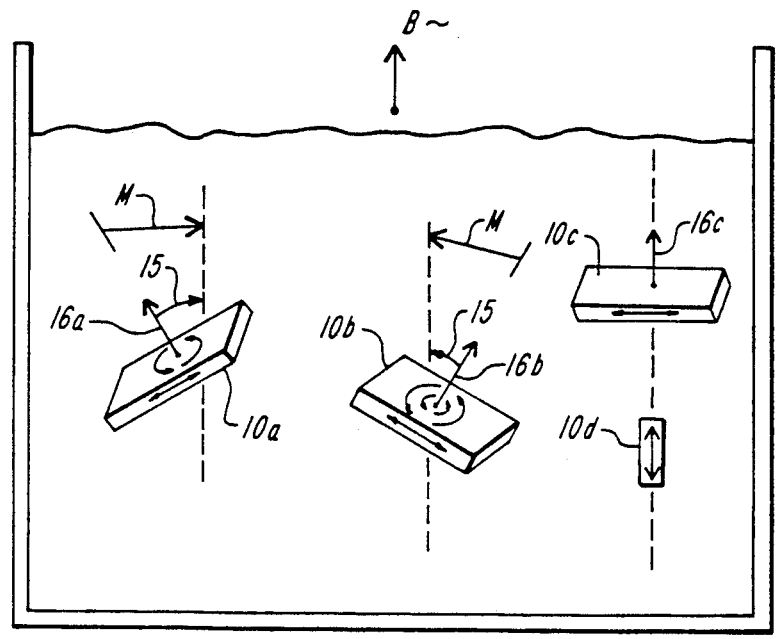
FIG. 2 is a diagram of a first embodiment of the method for performing crystal alignment according to the present invention showing crystal alignment in a decreasing magnetic field.

According to one embodiment of the present invention, crystals 10a–10d, FIG. 2, with a plane of high conductivity, typically the (ab) plane, are suspended in a viscous liquid. This viscosity of the liquid (w) should be high enough to prevent oscillations of the crystals near a position of equilibrium while being acted upon the aligning magnetic force. The viscosity should also be low enough to allow the aligning force to align the crystal during the time it is applied.

The eddy currents are induced into the crystals when the crystals are placed into a changing magnetic field $B\sim$. These eddy currents in turn produce an induced magnetic moment 16a–16c in each crystal. This induced magnetic moment can be represented as the result of the superposition of two perpendicular magnetic moments, one created by eddy currents induced in the (ab) plane $m^{(ab)}$ and the other perpendicular to the (ab) plane (plane cx) $m^{(cx)}$ of the crystal. The ratio of magnitudes of these magnetic moments $k^m = m^{(ab)}/m^{(cx)}$ is equal to the ratio $k^i$ of eddy current magnitudes ($i^{(ab)}$ and $i^{(cx)}$ respectively) in the case wherein the crystal is of nearly spherical shape in which case $k^m = k^i$. In the case of flat (ab) plane scaly crystals however, $k^m$ is equal to the product of $k^i$ and $k^g$ wherein $k^g$ is equal to the geometric ratio $k^g = 2r/s$ of diameter 2r (2 radius) and thickness s of the crystal as is the case when the plane of high conductivity exists because of geometrical shape as depicted in FIG. 1.

The value of the eddy currents in a given plane pq, typically the ab plane, is dependant upon the angle $A^{(pq)}$ between this plane ($A^{ab}$ in the typical case), the applied non-static magnetic field $B\sim$, and the conductivity in the (pq) plane, $G^{(ab)}$, and is proportional to the product $(G^{(pq)})(\sin A^{(pq)})$. Therefore, $$k^m = [G^{(ab)}/G^{(cx)}] [\sin A^{(ab)}/\sin A^{(cx)}] \qquad (1)$$

in the case of generally spherical crystals and $$k^m = [G^{(ab)}/G^{(cx)}] [2r/s] [\sin A^{(ab)}/\sin A^{(cx)}] \qquad (2)$$

in the case of crystals having shape anisotropy.

Typically, $G^{(ab)}/G^{(cx)} \gg 1$ and $2r/s \gg 1$ in the cases under consideration, therefore $k^m \gg 1$ except that $A^{(ab)}$ is in the vicinity of zero when the (ab) plane is nearly parallel to B∼ as represented by crystal 10d, FIG. 2. In such a suspension of crystals, all directions of (ab) plane have equal probability, therefore the number of crystals with $|A^{(ab)}|$ equal to 0° is negligible. Thus, the behavior of the crystal suspension in magnetic field B∼ is generally completely determined by the induced magnetic moment $m^{(ab)}$. These induced magnetic moments are perpendicular to the (ab) plane and are created by eddy currents in the (ab) plane.

FIG. 2 illustrates the behavior of a crystal suspension in a decreasing magnetic field B∼ (dB∼/dt<0). In this case, angles M between the induced magnetic moments $m^{(ab)}$ and B∼ are acute angles, and $|m^{(ab)}|$ is proportional to $|dB\sim/dt|$. A rotating angular moment Z acts on the crystal as given by $\vec{Z}=[\vec{m}^{(ab)}\times\vec{B}\sim]$ (in the drawing, this direction of rotation is shown by arrows 15). This angular moment Z rotates the crystal so as to make the induced magnetic moment $m^{(ab)}$ parallel to B∼. The action of the rotating angular moment Z diminishes with the angle M until the angle M become equal to zero and correspondingly, Z becomes equal to zero. The rotation of any crystal will therefore stop in the position where the (ab) plane is perpendicular to B∼ for $A^{(ab)}+M=90°$.

The dependence of angle M on time t in the process of orientation is governed by the equation:

$$I(d^2M/dt^2) = -K^0B\sim(dB\sim/dt)\sin(2M) + 2K^0B\sim^2 \sin^2 M - K^1(dM/dt) \quad (3)$$

where $K^0=sr^2G^{(ab)}/8$; $K^1=6\omega wr^3$ and I is the moment of inertia of the crystal along the axis of rotation.

The approximate solution of equation (3) for the first moment of time in the case of a high viscosity (for instance, equal to approximately 0.1 cp) and the initial value of M=45° gives the logarithmic decreasing of angle M with time according to the formula:

$$M(t) = 0.5 \log[\{1+LB\sim^2(t)\}/\{1+LB\sim^2(0)\}] + 45° \quad (4)$$

where B∼(0) is the initial value of B∼(t) and $L=K^0/K^1$.

The orientation of the suspended crystals is the result of the action of decreasing magnetic field B∼. The crystals orient so that their (ab) planes become perpendicular to B∼.

Figure 3:
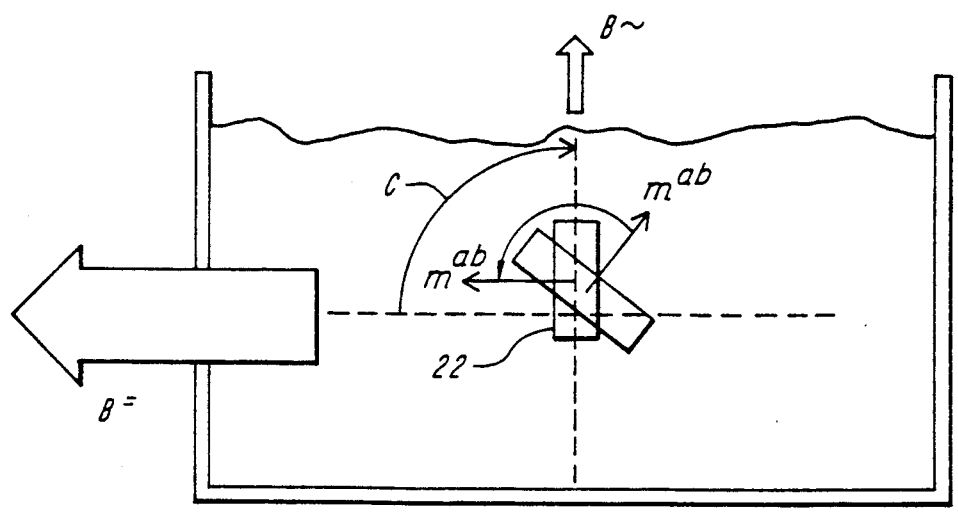
FIG. 3 is a diagram of another embodiment of the present invention illustrating the simultaneous application of a decreasing magnetic field and a constant magnetic field to provide a more thorough in-plane alignment.

In another embodiment of the present invention, the behavior of a suspension of crystals with anisotropy of conductivity is illustrated, in FIG. 3, in a magnetic field that is the superposition of decreasing magnetic field B∼ (dB∼/dt<0) and a constant magnetic field B=. An angle C between B∼ and B= is an acute angle and $|B=|\gg|B\sim|$. The ratio of $|B=|$ to $|B\sim|$ is typically no less than 10. The magnetic moments $m^{(ab)}$ are induced in the crystals 22 as was described above, and the magnetic moments form an acute angle with both B∼ and B=. The crystals turn so that all of the induced magnetic moments $m^{(ab)}$ become parallel to B=. Thus for $|B=|\gg|B\sim|$, the interaction of the induced magnetic moments with B= is overwhelming. The induced magnetic moments $m^{(ab)}$ are now parallel to B= and the (ab) planes of the crystals are now perpendicular to the B= direction.

Thus, the ultimate orientation of the suspension of crystals 22 is the result of the action of the combination of the decreasing magnetic field B∼ and the constant magnetic field B=. In this combination, $|B=|\gg|B\sim|$ and B= makes an acute angle with B∼. The crystals orient so that their (ab) planes are perpendicular to the B= direction and the magnetic moments $m^{(ab)}$ are parallel with B=.

Figure 4:
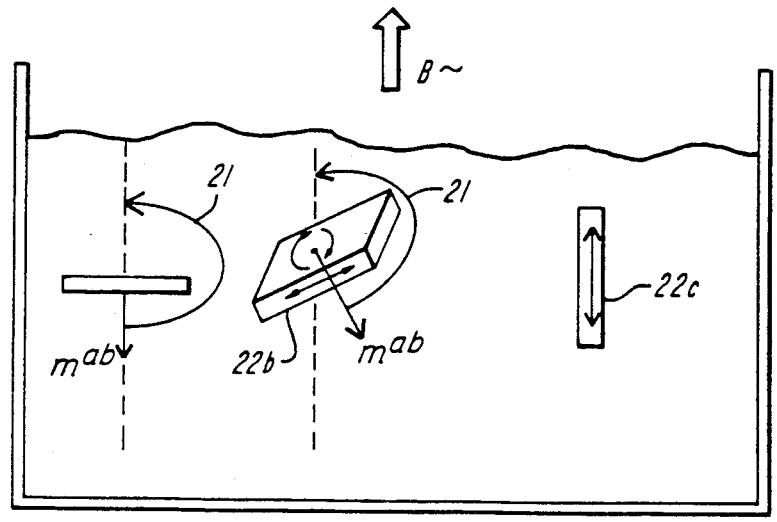
FIG. 4 is a diagram of an additional embodiment of the method of the present invention utilizing an increasing or alternating magnetic field to provide in-plane crystal alignment.

In yet another embodiment, the behavior of a suspension of crystals 24, FIG. 4, is shown in an increasing magnetic field B∼ (dB∼/dt>0). In this case, all angles M between the induced magnetic moments $m^{(ab)}$ and the non-static applied magnetic field B∼ are obtuse angles, and $|m^{(ab)}|$ is proportional to $|dB\sim/dt|$. A rotating angular moment F (in the drawings this is indicated generally by arrows 21) acts on the crystals according to the formula $\vec{F}=[\vec{m}^{(ab)}\times\vec{B}\sim]$. This angular moment F rotates the crystal so as to make $m^{(ab)}$ parallel to B∼, while this action diminishes the angle M. The angles M become equal to 90° in the process and since $A^{(ab)}=0$ so $m^{(ab)}$ also becomes equal to zero. Thus, F becomes zero and the rotation of any crystal will stop in the position where its (ab) plane is parallel to B∼. Any further changes of value of B∼ cannot induce any eddy currents in the crystals in this position (for $A^{(ab)}=0$) so therefore this is the position of stabile equilibrium and the field B∼ can therefore now be removed once the crystals have become fixed.

Since subjecting the suspended crystals to only a decreasing magnetic field as illustrated in FIG. 2 can result in even a small percentage of the crystals with their plane of high conductivity parallel to the applied magnetic field (as shown by crystal 10d), an increasing magnetic field or an alternating magnetic field as described immediately above in conjunction with FIG. 4 results in a more complete alignment about an axis parallel to the axis of the applied increasing or alternating magnetic field.

In summary, the orientation of the suspended crystals is the result of the action of increasing or alternating magnetic field B∼. The crystals orient so that their (ab) planes are aligned parallel to the applied magnetic field B∼.

Figure 5:
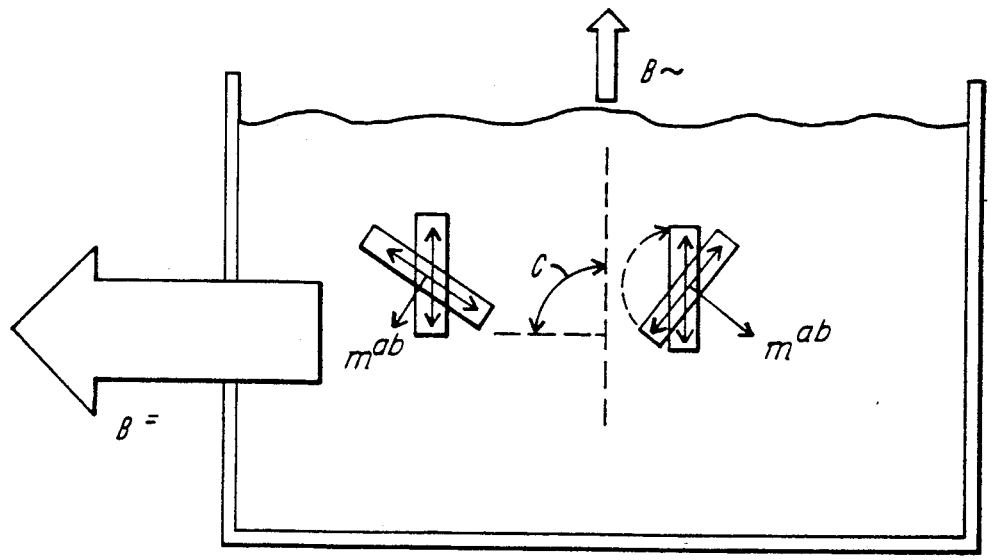
FIG. 5 is a diagram illustrating a further embodiment utilizing an increasing or alternating magnetic field in addition to the simultaneous application of a constant magnetic field.

A further embodiment of the present invention is illustrated in FIG. 5 which shows the behavior of a suspension of crystals with anisotropy of conductivity in a magnetic field that includes the superposition of an increasing or alternating magnetic field B∼ (dB∼/dt>0) and a constant magnetic field B=. An angle C between B∼ and B= is right or obtuse but less than flat, and $B=|\gg|B\sim|$ wherein their ratios is no less than 10.

The magnetic moments $m^{(ab)}$ are induced in the crystals as was described above. The induced magnetic moments make an obtuse angle with the non-static magnetic field B∼, and an acute angle with the constant magnetic field B=. The crystals turn until their induced magnetic moments $m^{(ab)}$ are parallel to B= since $|B=|\gg|B\sim|$ and so the interaction of these induced magnetic moments is predominantly with B=. The magnetic moments $m^{(ab)}$ are now parallel to B= and the high conductivity (ab) planes of these crystals are now perpendicular to the B= direction.

The induction of eddy currents and magnetic moments in the crystals cease and $m^{(ab)}$ becomes equal to zero. In case wherein the field B= is perpendicular to the increasing or alternating field B∼, this position is the position of stabile equilibrium.

The equation that governs the dependence of M upon the time t is similar to equation 3. Its solution results in the logarithmic increasing of M with time t as shown by:

$$M(t) = \log\{1 + L^1 B\sim(t)\} + 45°  \quad (5)$$

where $L^1 = 2LB^=$ (in the same approximations as for equation (4) with an additional condition of $B\sim(0) = 0$).

The orientation of the suspension of crystals is the result of the combined action of the increasing or alternating magnetic field $B\sim$ and the constant magnetic field $B^=$. In this combination, $|B^=| \gg |B\sim|$ and $B^=$ makes an obtuse or right angle with $B\sim$ in case of an alternating field $B\sim$, and a right angle with $B\sim$ in case of an alternating field $B\sim$. The crystals orient so that their (ab) planes are perpendicular to the $B^=$ magnetic field direction.

The crystals of superconductors may have one or more rare earth constituents which establish an intrinsic or "built-in" magnetic moment $m^{re}$ within the (ab) plane. Moreover, the presence of these rare earth constituents is an essential condition for multiaxial magnetic field alignment of the crystals. Crystals with these "built-in" magnetic moments $m^{(re)}$ tend to orient so that the intrinsic magnetic moments $m^{(re)}$ are parallel to the applied non-static magnetic field $B\sim$ in the case of only the non-static magnetic field, and parallel to the applied constant magnetic field $B^=$ in the combination of constant and non-static magnetic fields. In other words, the intrinsic or "built-in" magnetic moment $m^{(re)}$ will always align parallel to the overwhelming magnetic field.

The competing alignment forces in both cases are given by $|\vec{f}| = |[\vec{m}^{(re)} \times \vec{B}\sim]|$ or $|\vec{f}| = |[\vec{m}^{(re)} \times \vec{B}^=]|$ and $|\vec{F}| = |[\vec{m}^{(ab)} \times \vec{B}\sim]|$ or $|\vec{F}| = |[\vec{m}^{(ab)} \times \vec{B}^=]|$ when $B^=$ is not perpendicular to $B\sim$. One needs $|\vec{f}| \ll |\vec{F}|$ to accomplish the above (ab) plane alignment. It can be provided if $|m^{(ab)}| \gg |m^{(re)}|$. The rare earth intrinsic magnetic moment $m^{(re)}$ depends on nature and concentration of the rare earth constituents and does not depend on the magnitude of the applied non-static or constant magnetic field. The induced magnetic moment $m^{(ab)}$ is proportional to the magnitude of $|dB\sim/dt|$. Thus, $|m^{(ab)}|$ can be made the overwhelming magnetic moment by a sufficient increase in the magnitude of $|dB\sim/dt|$ and the force F can be made much greater than force f. This means that the (ab) plane alignment can be provided by a decreasing magnetic field $B\sim$ and a constant field $B^=$ ($B^=$ is not perpendicular to $B\sim$) even in the case where the aligned crystals have a "built-in" magnetic moment $m^{(re)}$ that is not co-linear with its c-axis. Thus, this alignment is provided by proper enhancement of $|dB\sim/dt|$.

Figure 6:
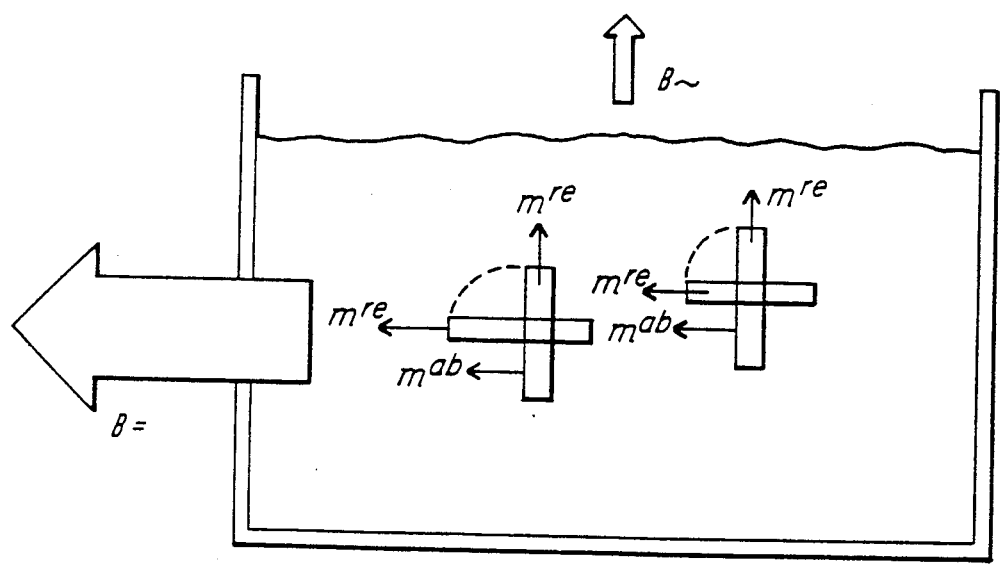
FIG. 6 is a diagram of an additional embodiment utilizing the method of the present invention on a crystal including a magnetic moment provided by a rare earth element of the crystal for providing complete dual axial alignment of the crystals.

It was mentioned that the alignment technique of the present invention is particularly suitable as the first step of biaxial alignment of the crystals with an intrinsic rare earth magnetic moment $m^{(re)}$ as shown in FIG. 6. In this example, $m^{(re)}$ may be parallel to the crystal's a-axis. The combination of an increasing or alternating magnetic field $B\sim$ with a constant field $B^=$ perpendicular to it is the best for this purpose. It was explained above that when placed in this magnetic field combination, the crystals orient so that their (ab) planes are parallel to the $B\sim$ direction wherein the induced eddy currents cease leaving only the rare earth magnetic moment of the crystals $m^{(re)}$. The action of $B^=$ upon $m^{(re)}$ is then overwhelming for $|B^=| \gg |B\sim|$ and the intrinsic magnetic moments $m^{(re)}$ orient parallel to the $B^=$ field direction. The result is the biaxial orientation of the crystals in which the (ab) plane is parallel to the $B\sim$ direction and the a-axis (as a result of $m^{(re)}$) is parallel to the $B^=$ direction.

Biaxial alignment can thus be provided in a crystal having a rare earth constituent by the combined action of an increasing or alternation magnetic field $B\sim$ along a constant magnetic field $B^=$.

Finally, and in all cases, the suspension of oriented crystals may be heated to evaporate the liquid and the crystalline material may be consolidated and shaped into its desired form. In case of multiaxial alignment of superconductors, the alignment technique of the present invention may be used as either a first or last stage of the total aligning procedure.

Modifications and substitutions by one of ordinary skill in the art are considered to be within the scope of the present invention which is not to be limited except by the claims which follow.

I claim:

1. A method of processing a precursor for an oxide superconductive crystalline material comprising the steps of:
   providing a precursor for an oxide superconductive crystalline material comprising crystals having one preferential plane of high conductivity in a form in which said crystals may be oriented in response to at least one applied magnetic field;
   applying at least a non-static magnetic field having a magnitude that increases or decreases as a function of time in a first direction to induce eddy currents in said preferential plane of high conductivity, said eddy currents including a magnetic moment normal to said preferential plane of high conductivity in each of said crystals, said induced magnetic moment aligning each of said crystals within a predetermined plane with respect to said first direction of said applied non-static magnetic field; and
   maintaining the orientation of said crystals in said predetermined position with respect to said first direction of said non-static magnetic field while said crystalline material becomes fixed.

2. The method of claim 1 wherein said non-static magnetic field includes a decreasing magnetic field; and
   wherein said predetermined plane of crystal alignment is perpendicular to said first direction of said applied non-static magnetic field.

3. The method of claim 1 wherein said step of applying at least a non-static magnetic field includes applying a combination of a decreasing magnetic field and a constant magnetic field having a fixed value;
   wherein said decreasing and constant magnetic fields are applied at an angle C with respect to one another; and
   wherein said preferential plane of high conductivity of each of said crystals is aligned perpendicular to said second direction of said constant magnetic field.

4. The method of claim 3 wherein the fixed value of said constant magnetic field is at least 10 times greater than a maximum value of said decreasing magnetic field.

5. The method of claim 3 wherein said angle C is less than or equal to 90°.

6. The method of claim 1 wherein said non-static magnetic field includes an increasing magnetic field; and
   wherein said predetermined plane of crystal alignment is parallel to said first direction of said applied non-static magnetic field.

7. The method of claim 1 wherein said step of applying at least a non-static magnetic field includes the step of applying a combination of an increasing magnetic field and a constant magnetic field having a fixed value;

wherein said increasing and said constant magnetic fields are applied at an angle C with respect to one another; and wherein the preferential plane of high conductivity of each of said crystals is aligned parallel to the direction of said applied constant magnetic field.

8. The method of claim 6 wherein said angle C is greater than or equal to 90° but less than or equal to 180°.

9. The method of claim 7 wherein the value of said constant magnetic field is at least 10 times greater than a maximum value of said increasing magnetic field.

10. The method of claim 6 wherein said increasing magnetic field includes an alternating magnetic field.

11. The method of claim 7 wherein said increasing magnetic field includes a alternating magnetic field.

12. The method of claim 7 wherein each of said crystals of said crystalline material includes a rare earth element, said rare earth element providing an intrinsic magnetic moment predictably oriented along a predetermined crystal axis which lies within an (ab) plane of each of said crystals, said magnetic moment being determined by said at least one selected rare earth element; and wherein said induced magnetic moment is responsive to said increasing magnetic field to align each of said crystals within a plane parallel to said increasing magnetic field, and wherein said intrinsic magnetic moment is responsive to said constant magnetic field to further align said crystals within a second plane, parallel to said constant magnetic field and normal to said increasing magnetic field, thereby providing biaxial crystal alignment.

13. A method of processing precursor for an oxide superconductive crystalline material to provide dual axis crystal alignment, comprising the steps of:

providing a precursor for an oxide superconductive crystalline material comprising crystals having one preferential plane of high conductivity and a rare earth element, said rare earth element providing an intrinsic magnetic moment predictably oriented along a predetermined crystal axis which lies within an ab plane of each of said crystals, said crystals provided in a form in which said crystals may be oriented in response to applied magnetic fields, said magnetic moment being determined by said at least one selected rare earth element;

applying a non-static magnetic field having a magnitude that increases or decreases as a function of time in a first direction to induce eddy currents in said preferential plane of high conductivity, said eddy currents inducing a magnetic moment normal to said preferential plane of high conductivity in each of said crystals, said induced magnetic moment aligning each of said crystals within a predetermined plane with respect to said first direction of said applied non-static magnetic field;

applying a constant magnetic field in a second direction normal to said first direction of said applied non-static magnetic field, said constant magnetic field having a value at least 10 times greater than a maximum value of said non-static magnetic field, and wherein said intrinsic magnetic moment of each of said crystals is responsive to said constant magnetic field, to further align said crystals within a second plane, parallel to said constant magnetic field and normal to said non-static magnetic field, thereby providing biaxial crystal alignment; and maintaining the orientation of said crystals while said crystalline material becomes fixed.

* * * * *

UNITED STATES PATENT AND TRADEMARK OFFICE
CERTIFICATE OF CORRECTION

PATENT NO. : 5,280,011
DATED : January 18, 1994
INVENTOR(S) : Alexander M. Kraitsberg It is certified that error appears in the above-identified patent and that said Letters Patent is hereby corrected as shown below:

Column 5, the portion of Equation 3 which reads "~$K^0$" should read -- -$K^0$ --.

Column 5, line 31, the portion that reads "$6\omega wr^3$" should read --$6\pi wr^3$--.

Column 5, the portion of Equation 4 which reads "0.5l$og$" should read --0.5 log--.

Signed and Sealed this

Thirteenth Day of September, 1994

Attest:

BRUCE LEHMAN

Attesting Officer     Commissioner of Patents and Trademarks